(12) United States Patent
Kwak et al.

(10) Patent No.: US 9,450,135 B2
(45) Date of Patent: Sep. 20, 2016

(54) PLASMA ENHANCED THERMAL EVAPORATOR

(71) Applicant: Applied Materials, Inc., Santa Clara, CA (US)

(72) Inventors: Byung-sung Kwak, Portland, OR (US); Kaushal K. Singh, Santa Clara, CA (US); Stefan Bangert, Steinau (DE); Nety M. Krishna, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/294,644

(22) Filed: Jun. 3, 2014

(65) Prior Publication Data

US 2014/0287550 A1  Sep. 25, 2014

Related U.S. Application Data

(62) Division of application No. 12/763,856, filed on Apr. 20, 2010, now abandoned.

(60) Provisional application No. 61/170,989, filed on Apr. 20, 2009.

(51) Int. Cl.
*H01L 31/18* (2006.01)

(52) U.S. Cl.
CPC .................................. *H01L 31/18* (2013.01)

(58) Field of Classification Search
None
See application file for complete search history.

(56) References Cited

U.S. PATENT DOCUMENTS

2009/0215224 A1* 8/2009 Li et al. .................. 438/102

OTHER PUBLICATIONS

Tribollet et al., "Study of selenium clusters, evidence of packing structure", Z.Phys. D—Atoms, Molecules and Clusters, 24, pp. 87-93, 1992.*

* cited by examiner

*Primary Examiner* — Scott B Geyer
(74) *Attorney, Agent, or Firm* — Patterson & Sheridan, LLP

(57) ABSTRACT

The present invention generally provides a method for forming a photovoltaic device including evaporating a source material to form a large molecule processing gas and flowing the large molecule processing gas through a gas distribution showerhead and into a processing area of a processing chamber having a substrate therein. The method includes generating a small molecule processing gas, and reacting the small molecule processing gas with a film already deposited on a substrate surface to form a semiconductor film. Additionally, apparatuses that may use the methods are also provided to enable continuous inline CIGS type solar cell formation.

12 Claims, 8 Drawing Sheets

PLASMA ENHANCED THERMAL EVAPORATOR

CROSS-REFERENCE TO RELATED APPLICATIONS

This application is a divisional application of U.S. patent application Ser. No. 12/763,856, filed Apr. 20, 2010, which application claims the benefit of U.S. Provisional Patent Application Ser. No. 61/170,989, filed Apr. 20, 2009. Both are herein incorporated by reference.

BACKGROUND OF THE INVENTION

1. Field of the Invention

Embodiments of the present invention generally relate to inline continuous formation of photovoltaic solar cells. In particular, embodiments of the invention relate to improving the selenization process for forming copper indium gallium selenium type photovoltaic solar cells.

2. Description of the Related Art

Solar cells are photovoltaic (PV) devices that convert sunlight directly into electrical power. PV devices typically have one or more p-n junctions, sometimes referred to as a homojunction p-n system. Each junction comprises two different regions within a semiconductor material where one side is denoted as the p-type region and the other as the n-type region. When the p-n junction of the PV cell is exposed to sunlight (consisting of energy from photons), the sunlight is directly converted to electricity through the PV effect. PV solar cells generate a specific amount of electric power, and cells are tiled into modules sized to deliver the desired amount of system power. PV modules are joined into panels with specific frames and connectors. The solar cells are commonly formed on a silicon substrate, which may be in the form of single or multicrystalline silicon substrates or have microcrystalline or amorphous type silicon films deposited on substrates. A typical PV cell includes a p-type silicon substrate or sheet typically less than about 0.3 mm thick with a thin layer of n-type silicon on top of a p-type region formed in a substrate.

Other types of solar cells may use a more complex heterojunction system to generate electricity. A heterojunction is an interface that occurs between two layers of dissimilar crystalline semiconductors creating unequal band gaps as opposed to a homojunction. One example of a heterojunction system is a copper indium gallium selenide type solar cell or CIGS.

The photovoltaic market has experienced growth with annual growth rates exceeding above 30% for the last ten years. Some articles have suggested that solar cell power production world wide may exceed 10 GWp in the near future. It has been estimated that more than 95% of all photovoltaic modules are silicon wafer based. The high market growth rate in combination with the need to substantially reduce solar electricity costs has resulted in a number of serious challenges for inexpensively forming high quality photovoltaic devices. Therefore, one major component in making commercially viable solar cells is reducing the manufacturing costs required to form the solar cells, such as by improving the device yield and increasing the substrate throughput.

One of the biggest hindrances to reducing current manufacturing costs of CIGS type solar cells is the inability to efficiently implement the selenization operation in an inline continuous production process. Current processes are not well adapted for inline continuous production and also may lack CIGS phase uniformity. Therefore, there is a need in CIGS type solar cell manufacturing to provide apparatuses and processes that adequately implement the selenization process of CIGS type solar cells to improve the device yield, CIGS film uniformity, and produce a lower cost of ownership (CoO) than other known apparatuses and methods.

SUMMARY OF THE INVENTION

The present invention generally provides a method for forming a photovoltaic device including evaporating a source material to form a large molecule processing gas and flowing the large molecule processing gas through a gas distribution showerhead and into a processing area of a processing chamber having a substrate therein. The method also includes igniting a plasma from the large molecule processing gas, generating a small molecule processing gas with the plasma, and reacting the small molecule processing gas with a film already deposited on a substrate surface to form a semiconductor film.

Embodiments of the invention further provide a method for forming a photovoltaic device including evaporating a source material to form a large molecule processing gas and flowing the large molecule processing gas through a gas distribution showerhead and into a processing area of a processing chamber having a substrate therein. The method also includes electrically biasing the showerhead to increase the energy level of the large molecule processing gas within the processing area without igniting a plasma in the processing area, generating a small molecule processing gas by colliding processing gas molecules with each other, and reacting the small molecule processing gas with a film already deposited on a substrate surface.

Embodiments of the invention further provide a method for forming a photovoltaic device, including evaporating a source material to form a large molecule processing gas and flowing the large molecule processing gas through a gas distribution showerhead and into a processing area of a processing chamber having a substrate therein. The method also includes igniting a plasma in a remote plasma source, flowing ionized molecules from the remote plasma source, through a linear plasma showerhead, and into the processing area. The method further includes generating a small molecule processing gas with the ionized molecules, and reacting the small molecule processing gas with a film already deposited on a substrate surface.

In another embodiment, an apparatus for processing a substrate in a continuous inline photovoltaic device production process is provided. The apparatus includes a processing chamber body, a substrate positioner, and a linear gas distribution showerhead disposed in the processing chamber body, where the linear gas distribution showerhead is electrically coupled to a power source. The apparatus further includes a gas conduit coupled to the showerhead and an evaporator coupled to the gas conduit.

In yet another embodiment, an apparatus for processing a substrate in a continuous inline photovoltaic device production process is provided. The apparatus includes a processing chamber body and a substrate positioner. The apparatus also includes a linear remote plasma distribution showerhead disposed in the processing chamber body and a remote plasma source coupled to the linear remote plasma distribution showerhead where the remote plasma source is electrically coupled to a power source. The apparatus further includes a linear gas distribution showerhead disposed in the processing chamber body, a gas conduit coupled to the showerhead, and an evaporator coupled to the gas conduit.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present inventions provide methods and apparatuses for forming a photovoltaic cell device, such as a solar cell, that utilizes lower temperature processes for forming photovoltaic cell devices as part of a continuous inline solar cell production process. In one embodiment, the apparatuses are adapted to perform selenization of an alloy comprising copper (Cu), indium (In), and gallium (Ga) for forming a copper, indium, gallium, and selenium or CIGS type photovoltaic solar cell device. In forming CIGS type PV solar cells, it is important to have a good reaction to form the right alloy phase of CIGS material. The following embodiments improve the ability to form the right phase of CIGS material, especially for a continuous inline production system. In one embodiment, the methods may be used with a New Aristo, Aton or Endura platform, among others, which are available from Applied Materials, Inc. of Santa Clara, Calif. While the discussion below primarily discusses the processes of selenization of a CIG film in manufacturing solar cell devices, this configuration is not intended to be limiting as to the scope of the embodiments of the inventions described herein.

It should be understood throughout this disclosure that plasma is generally understood to be a partially ionized gas containing an equal number of positive and negative charges, as well as some other none ionized gas particles, and is thus generally overall electrically neutral. Molecules that have become radicalized or radicals have unpaired or single electrons on an otherwise open shell configuration, substantially increasing their reactivity. Ionized molecules in a plasma still have paired electrons, though the plasma state increases the ionized molecules excitement level and reactivity, though not as highly reactive as radicals.

Figure 1:
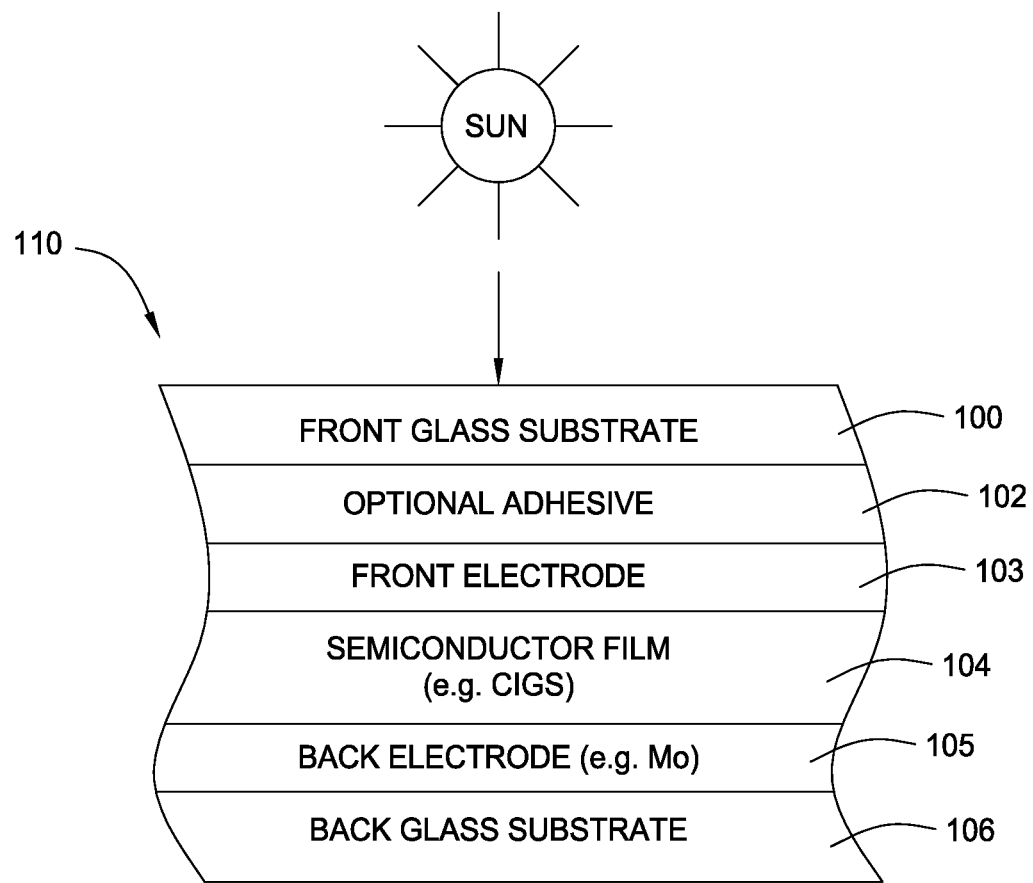
FIG. 1 depicts a cross-sectional view of an example of a photovoltaic device according to one embodiment of the invention.

FIG. 1 depicts a cross-sectional view of a CIGS type photovoltaic solar cell device, according to one embodiment of the invention. The photovoltaic device includes transparent front glass substrate 100, optional adhesive layer 102, single layer or multilayer front conductive electrode 103, active semiconductor film 104 including one or more semiconductor layers (such as CIGS or the like), electrically conductive back electrode/reflector 105 (such as Molybdenum or Mo), and back glass substrate 106. Back electrode 105 is preferably continuous or substantially continuous across all or a substantial portion of back glass substrate 106, although it may be patterned into a desired design (e.g., stripes) in certain instances. The optional adhesive layer 102 may comprise one or more of an electrically insulating polymer based encapsulant or adhesive of a material such as ethyl vinyl acetate (EVA), polyvinyl butyral (PVB), or the like. Of course, other layer(s) which are not shown may also be provided in the device. For instance, buffer and/or window layer(s) may also optionally be provided.

Figure 2:
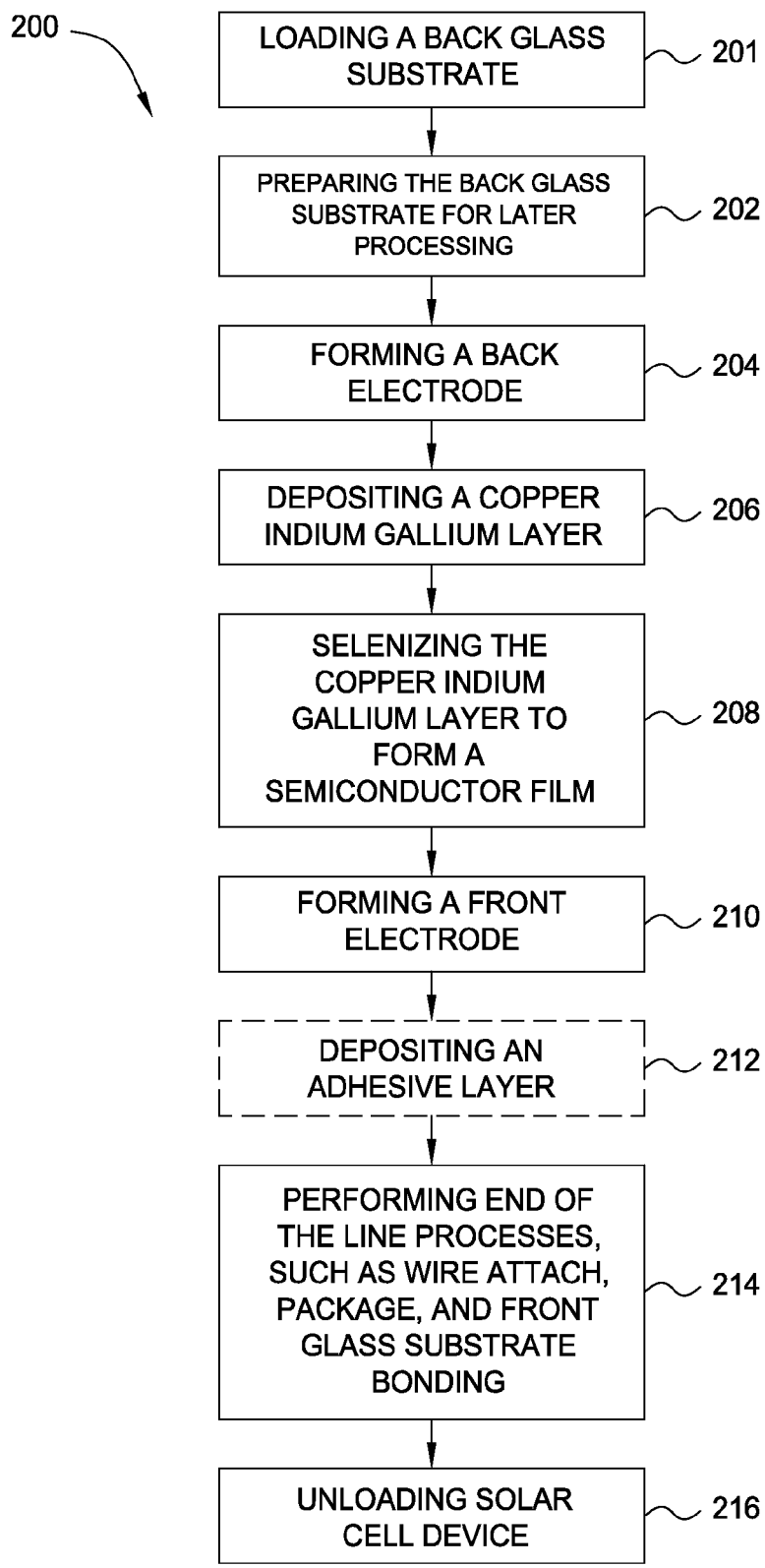
FIG. 2 depicts a partial flow diagram for manufacturing solar cell devices on a substrate in a continuous inline production process.

FIG. 2 depicts a process sequence 200 for manufacturing solar cell devices on a substrate in a continuous inline production process. The process sequence 200 may include a plurality of process operations performed in different processing modules and automation equipment for manufacturing the solar cell devices. It is noted that FIG. 2 only depicts a portion of the process operations performed during the manufacture of the solar cell devices. For example, various patterning operations may also be performed during the process sequence 200 for manufacturing solar cell devices. The configurations, number of processing operations, or order of the processing operations in the process sequence 200 is not intended to limit the scope of the invention described herein. Some other process operations of the process sequence are known to those skilled in the art and eliminated for sake of brevity.

The process sequence 200 starts at 201 by loading a back glass substrate into a solar cell production line. The production line may include a plurality of processing tools and automation equipment to operate as a continuous process and facilitate fabrication of the solar cells using the substrate. At 202, the back glass substrate is prepared for later processing, such as deposition operations, by cleaning and/or etching the glass substrate to improve film adhesion, among other purposes.

At 204, a back electrode is formed for example by depositing a molybdenum or Mo layer directly or indirectly on the back glass substrate in a deposition chamber. Referring first to FIG. 1, a back electrode 105 such as Mo is formed on the back glass substrate 106 at 204. Additionally, the Mo layer may be patterned by a laser scribe based device. At 206, a copper-indium-gallium layer is deposited over the back electrode 105, as shown in FIG. 1. The copper-indium-gallium may be formed by various processes such as a co-evaporative or co-sputtering process.

At 208, a selenization process is performed to form a semiconductor film 104, such as a CIGS layer, on the back electrode 105, as shown in the exemplary embodiment depicted in FIG. 1. The selenization process may be performed on the CIG film layer according to various methods and in suitable exemplary chambers discussed below with reference to FIGS. 3-10.

At 210, a front electrode 103 is deposited indirectly on the back glass substrate 106 in a deposition chamber, such as on the semiconductor film 104, as depicted in FIG. 1. The deposition chamber used to deposit the front electrode 103 may be similar to the back electrode deposition chamber utilized to deposit the back electrode 105 described at 204. Additionally, the front electrode may be patterned using a laser scribe based device. At 212, an optional adhesive layer 102 may be deposited on the front electrode 103, as depicted in FIG. 1. At 214, end of the line processes are performed on the back glass substrate 106 and other formed layers. The end of the line processes may include final wire attaching, bonding, packaging, and front glass substrate bonding processes.

At 216, after the support structure, wiring structures, or framing structures are formed on the substrate, the solar cell device 110 may be unloaded from the production line and the solar cell fabrication process is completed. It is noted that some other operations may be performed in between each operation to manufacture the solar cell devices. The process sequence 200 only provides an exemplary process sequence that includes only a portion of some major film deposition process operations to manufacture the devices. It is contemplated that other process sequences associated with the solar cell device fabrication may also be adapted to use a laser edge removal tool in addition to other tools used for solar cell device fabrication known to those of ordinary skill in the art.

The following discussion of FIGS. 3-10 shows various processing chambers and methods of forming photovoltaic cells that may be used in the inline processing sequence shown in FIG. 2 as part of an inline processing system. In particular, the chambers and processing methods are beneficial to perform the selenization operation 208 of FIG. 2 for forming a CIGS type photovoltaic cell.

Figure 3:
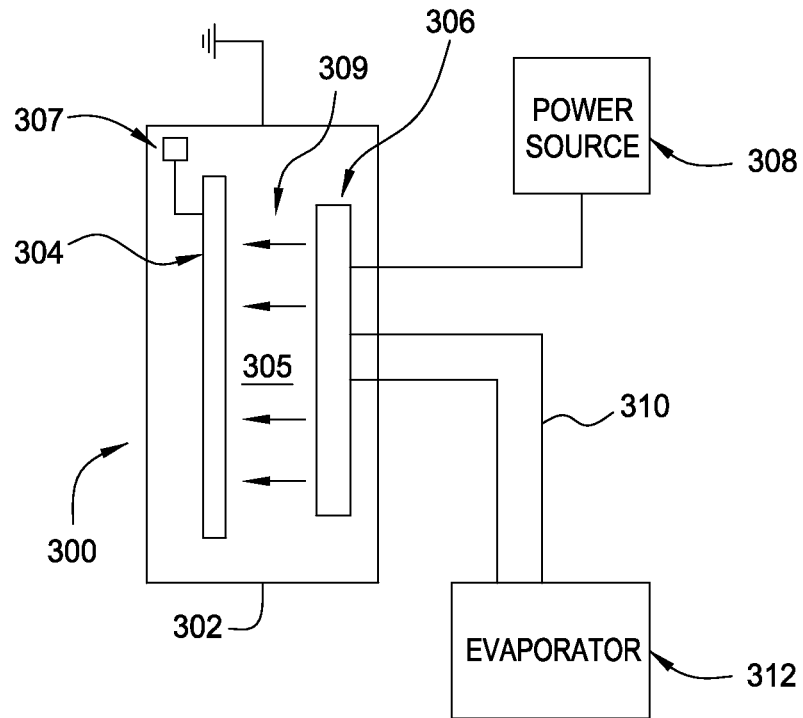
FIG. 3 depicts a schematic cross-sectional view of a processing chamber according to one embodiment of the invention.
Figure 4:
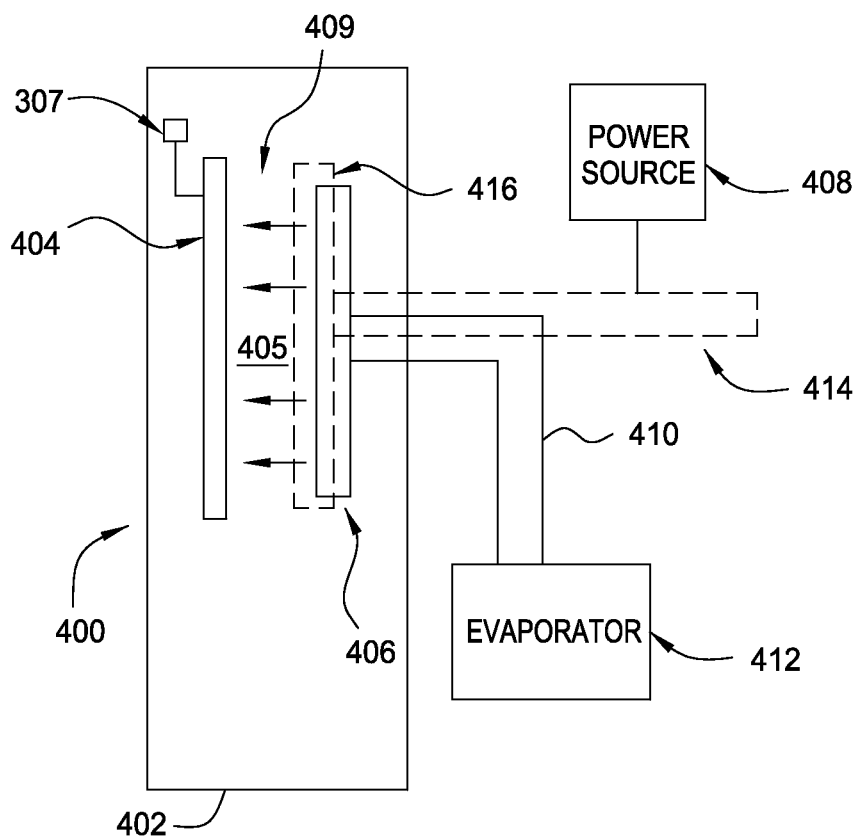
FIG. 4 depicts a schematic cross-sectional view of a processing chamber according to one embodiment of the invention.

Turning now to FIGS. 3 and 4, a schematic cross-sectional view of a processing chamber according to embodiments of the invention is depicted. In FIG. 3, an apparatus, such as a processing chamber body 300, for processing a substrate 304 in a continuous inline photovoltaic device production process is illustrated. The processing chamber includes a chamber wall 302 that helps to define a processing region 305 in between a substrate 304 and a gas distribution showerhead 306, such as a linear showerhead 306 shown in FIG. 3.

A substrate positioner 307 helps to position or move the substrate in and through the procession region 305. In one embodiment of the invention, the processing chamber processes substrates vertically, i.e. the linear gas distribution showerhead 306 is arranged vertically within the chamber and the substrate positioner 307 holds a substrate 304 in a vertical processing position as shown in FIG. 3. One advantage of this arrangement is that any particles created during processing will fall towards the bottom of the chamber and not contaminate the substrate 304. Additionally, in this configuration of the processing chamber, the primary method of heat transfer is sideways from the showerhead to the substrate as convective and radiated heat to aid in keeping the substrate at a sufficiently high required temperature to prevent condensation of process gases on the substrate without the commencement of desired reaction.

Figure 5:
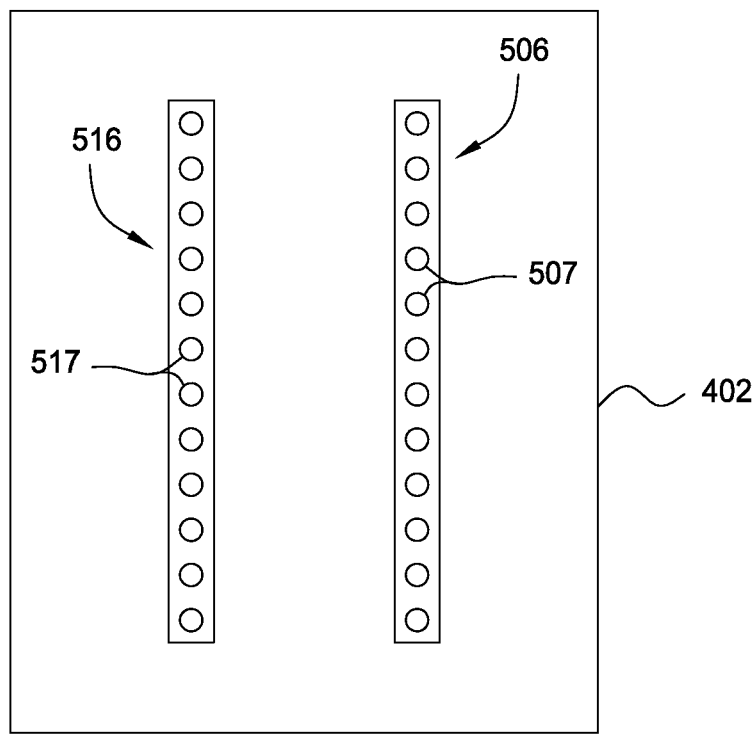
FIG. 5 depicts a schematic view of faces of two linear showerheads in a processing chamber according to one embodiment of the invention.
Figure 6:
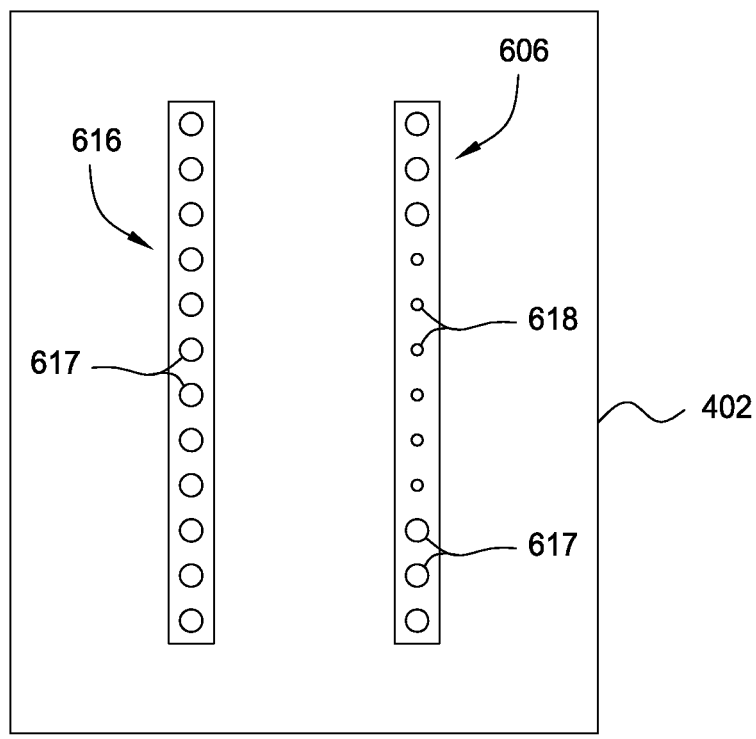
FIG. 6 depicts a schematic view of faces of two linear showerheads in a processing chamber according to one embodiment of the invention.

The linear gas distribution showerhead 306 disposed in the processing chamber body 300 is electrically coupled to a power source 308. A gas conduit 310 is further coupled to the linear showerhead 306. An evaporator 312 is coupled to the gas conduit 310 for flowing a vaporized source material within the evaporator through the linear showerhead 306 and into the processing region 305. The linear gas distribution showerhead 306 may further comprise passages of varying diameter size to modulate the gas flux in the processing region 305, examples of which are shown in FIGS. 5 and 6.

The power source 308 may be a direct current (DC), alternating current (AC), pulsed direct current (p-DC), radio frequency (RF), electron cyclotron resonance (ECR), or a microwave power source. Electromagnetic power is provided to the linear showerhead 306 as processing gas passes through the showerhead 306, into the processing region 305, and towards substrate 304, as depicted by arrows 309. More detail regarding the processes utilized in this chamber will be discussed below with reference to FIGS. 8 and 9. Whatever type of power source is chosen, the chamber needs to be adapted so it can couple the power source with the chamber in such a manner that will generate a plasma or further energize the processing gas but not to a plasma state as is subsequently discussed.

Turning now to FIG. 4, another embodiment of a processing chamber is depicted in a schematic cross-sectional view. In this embodiment, a remote plasma source is utilized. The apparatus includes a processing chamber body 400 having a chamber wall 402. A processing region 405 is defined by the chamber walls 402, the substrate 404, a linear gas distribution showerhead 406, and a linear remote plasma distribution showerhead 416.

A substrate positioner 407 helps to position the substrate 404 in the procession region 405. In one embodiment of the invention, the processing chamber processes substrates vertically, i.e. the linear gas distribution showerhead 406 and a linear remote plasma distribution showerhead 416 are arranged vertically within the chamber and the substrate positioner 407 holds a substrate 404 in a vertical processing position as shown in FIG. 4.

The linear gas distribution showerhead 406 disposed in the processing chamber body 400 is coupled to a gas conduit 410, which is further coupled to an evaporator 412 for flowing a vaporized source material in the evaporator through the linear showerhead 406 and into the processing region 405. The linear gas distribution showerhead 406 may further comprise passages of varying diameter to modulate the gas flux in the processing region 405, examples of which are shown in FIGS. 5 and 6. A remote plasma source 414 is coupled to the linear remote plasma distribution showerhead 416 and electrically coupled to a power source 408 as depicted in FIG. 4.

Although the showerheads shown in the figures are linear showerheads, other shapes of showerheads are also within the scope of the invention. What shape the showerhead should have will depend on both the type of chamber and the shape of the substrate. For example, a circular showerhead may be selected for a chamber that processes circular substrates, such as when processing semiconductor wafers, whereas a rectangular showerhead may be selected for processing large rectangular substrates, such as when processing thin-film-transistors for flat panel displays or PV solar cells. Batch processes may also make those types of showerhead shapes more preferable. For continuous inline processing of large size rectangular or square substrates, a linear showerhead may be selected to better control the distribution of process gases over the substrate as the substrate passes by the showerhead.

As before, the power source 408 may be a direct current (DC), alternating current (AC), pulsed direct current (p-DC), radio frequency (RF), electron cyclotron resonance (ECR), or a microwave power source. Electromagnetic power is provided to the remote plasma source 414 as gas passes through the remote plasma source 414, through the linear remote plasma distribution showerhead 416, into the processing region 405, and towards substrate 404, as depicted by arrows 409. Additionally, in any of the embodiments, the substrate may be electrically biased depending on the chamber configuration, type of power source coupled to the chamber, and the type of source materials and desired film to be deposited on the substrate. More detail regarding the processes utilized in this chamber will be subsequently discussed with reference to FIG. 10.

FIGS. 5 and 6 depict a schematic view of the faces of two linear showerheads in a processing chamber according to various embodiments of the invention. FIG. 5 shows the chamber body wall 402 surrounding the linear showerheads 506 and 516 as depicted in FIG. 4. In this embodiment, the linear gas distribution showerhead 506 and the linear plasma distribution showerhead 516 each have passageways 507 and 517 respectively that are the same diameter. In the embodiment shown in FIG. 6, the linear gas distribution showerhead 606 has varying diameter passageways, 617 and 618, for modulating the process gas flux from the linear gas distribution showerhead 606 and into the processing region. Other non-circular cross-sectional shapes of passageways may be used where the cross-sectional circumference or perimeter varies in size. For example square cross-sectional passageways may be used having a smaller cross-sectional perimeter compared to other square gas passageways on the same linear gas distribution showerhead. Although a perimeter is generally used in conjunction with non-circular shapes, it may also encompass circular shapes and thus their corresponding circumferences. Other various shapes and sizes of the gas passageway are within the scope of embodiments of the invention, and can be readily identified by those of ordinary skill in the art. Although FIGS. 5 and 6 depict the two showerhead configuration as depicted in FIG. 4, any of the linear gas distribution showerheads 506, 516, 606 and 616 may also be used in the processing chamber body 300 depicted in FIG. 3.

Figure 7:
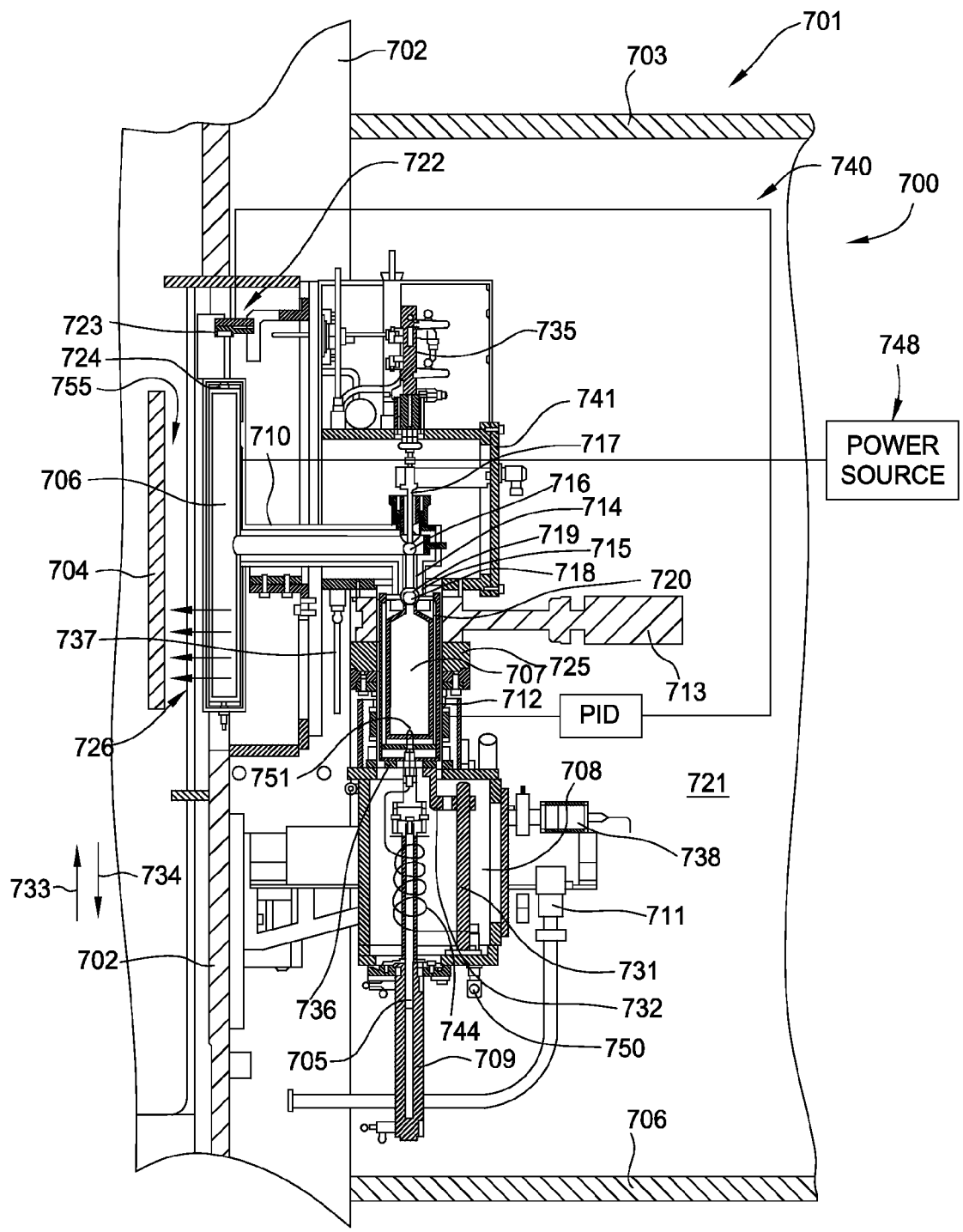
FIG. 7 depicts a schematic cross-sectional view of a processing chamber according to one embodiment of the invention.

Turning now to FIG. 7, a more detailed schematic view of a processing chamber according to an embodiment of the inventions is depicted. FIG. 7 shows a vapor feed system 701 for a processing chamber 700, such as a vacuum chamber. Only the chamber wall 702 of the processing chamber 700 is shown in this figure. The vapor feed system 701 comprises a vertically oriented linear gas distribution showerhead 706, opposite of which is disposed a substrate 704. The linear gas distribution showerhead 706 is provided with several gas passageways and is connected with gas conduit 710, which is directed at right angles to the linear gas distribution showerhead 706. This linear gas distribution showerhead 706, consequently, serves as a vapor distributor to flow process gas into a processing region 755.

The linear gas distribution showerhead 706 disposed in the processing chamber 700 is electrically coupled to a power source 748. As before, the power source 748 may be a direct current (DC), alternating current (AC), pulsed direct current (p-DC), radio frequency (RF), electron cyclotron resonance (ECR), or a microwave power source. Depending on the type of power source chosen in any of the embodiments, the chamber and power source may be altered to effectuate the proper coupling of electromagnetic energy with the chamber components either to generate a plasma, to merely energize the processing gas to a higher level of excitement, or to impart energy to growing film for enhanced reaction. For example, in a configuration having a RF type of power source connected to the linear showerhead 706, the gas conduit 710 may need to be electrically isolated from the showerhead 706, and requires an impedance matching network to couple the RF power to the chamber.

Parallel to the linear gas distribution showerhead 706 and perpendicular to the gas conduit 710 is provided a cylindrical evaporator crucible 707, which is located in an evaporator 712. If reactive materials, for example selenium, are vaporized in the evaporator crucible 707, the evaporator crucible 707 comprises a relatively inert material, such as, for example, stainless steel, titanium or molybdenum.

Beneath the evaporator crucible 707 is located a cylinder 709 with a piston 705. The evaporator crucible 707, which in FIG. 7 is in an upper position, can be raised and lowered by means of the piston 705. Laterally to the piston 705 is provided a vacuum valve 711, via which an evaporator chamber 708 can be evacuated or be flooded, for example with protective gas. However, since not only the evaporator crucible 707 may be exposed to the reactive source material, the entire vapor feed system may be comprised of a material that is inert relative to these reactive materials.

A linear guide 731 is located in this evaporator chamber 708, which contributes to the stabilization of the evaporator chamber 708. On this linear guide 731 is disposed a guide element 732 that is connected to the evaporator crucible 707. By moving the guide element 732 along the linear guide 731 the evaporator crucible 707 is also moved along the linear guide 731, i.e. in the direction of arrows 733 and 734.

With the aid of a separating valve 713, shown in FIG. 7 in the open state, the evaporator chamber 708 together with the evaporator crucible 707 can be separated from the gas conduit 710. This separating valve 713 is disposed on a spacer ring 725. The gas conduit 710 includes a downwardly directed connection fitting 714. A heating jacket 715 is also shown. The connection fitting 714 can be closed by means of an end piece 716 of a piston 705. This connection fitting 714 comprises a calotte-shaped part 719 into which the upper part 718 of the evaporator crucible 707 may engage. Piston 717 is connected with a cylinder by means of which the piston 717 can be moved. The cylinder 735 can be a pneumatically operated cylinder.

Within the evaporator chamber 708 is further evident a holding arrangement 736 that is placed onto the piston 705. A thermocouple 744 is wound from a vacuum-tight power feed through 750 in a spiral about the holding arrangement 736 and terminates in an indentation 751 located in the bottom of evaporator crucible 707. By means of the thermocouple 744 the temperature at the bottom of the vaporizer crucible 707 can be measured. The spiral winding of the thermocouple 744, that, on the one hand, is fastened on the power feed through 750 and on the other hand, on the holding arrangement 736, permits the necessary lift of evaporator crucible 707 from a lower position into an upper position. Thus, the thermocouple 744 can be moved in the direction of arrows 733 and 734, respectively, by means of piston 705.

FIG. 7 also shows a wall 703 of a glove box 740, which encompasses the evaporator crucible 707 and the evaporator chamber 708. It is thereby possible to exchange the evaporator crucible 707 under protective gas, such as argon, or to fill the evaporator crucible 707 with material. FIG. 7 shows the glove box 740 only segment-wise and schematically. According to embodiments of the invention, the glove box 740 may be removed to replace the evaporator, the source material in the evaporator crucible, and other parts, without exposing the processing region to the outside atmosphere and risk contamination, in addition to maintaining the processing region under vacuum if desired. This feature is enabled with the ability to block off the gas conduit 710 from the outside atmosphere with the separating valve 713.

FIG. 7 further shows a pressure gauge head 738 for measuring the pressure in the evaporator crucible 707. When the pressure in the evaporator crucible 707 reaches the desired value, the separating valve 713 is either opened or closed by means of a control not depicted in FIG. 7.

A cooling port 737 is also shown in FIG. 7. This cooling port 737 is connected with a supply unit (not shown), for a coolant, such as $H_2O$. If needed, the housing 741 is cooled with this coolant. The cooling port 737 may be connected to the supply unit via an element, for example a tubing of rubber, not shown in FIG. 7. If the coolant is $H_2O$, the supply unit can be a conventional water connection.

FIG. 7 shows the evaporator crucible 707 raised by the piston 705 so that the upper part 718 of evaporator crucible 707 is inserted into the calotte-shaped part 719 of connection fitting 714. The upper part 718 of the evaporator crucible 707 is here formed spherically while the lower part of connection fitting 714 is implemented in the form of a calotte. The separating valve 713 is opened.

A crucible heating system 720 encompasses the evaporator crucible 707. This crucible heating system 720 is connected with a PID controller 721 which, in turn, is connected with a rate acquisition unit 722. This rate acquisition unit 722 can be provided with a measuring instrument 723, for example an oscillating crystal or an emission spectroscope. This measuring instrument 723 acquires the vaporization rate of the source material that reaches the substrate 704 from the linear gas distribution showerhead 706. For this purpose, in the linear gas distribution showerhead 706, a special nozzle 724 is provided which generates a rate signal that is proportional to the coating rate on the substrate 704. Through this nozzle 724 streams the vapor onto the measuring instrument 723. In this manner, the heating system 720 can be regulated as a function of the coating rate. On the PID controller 721 can also be set a nominal value. Instead of a PID controller, another controller can also be provided. The vapor exiting the linear gas distribution showerhead 706 through the passageways is shown symbolically by arrows 726. The passageways are patterned in the linear distribution showerhead 706 such that high vaporization rates and uniform coating are attained.

Figure 8:
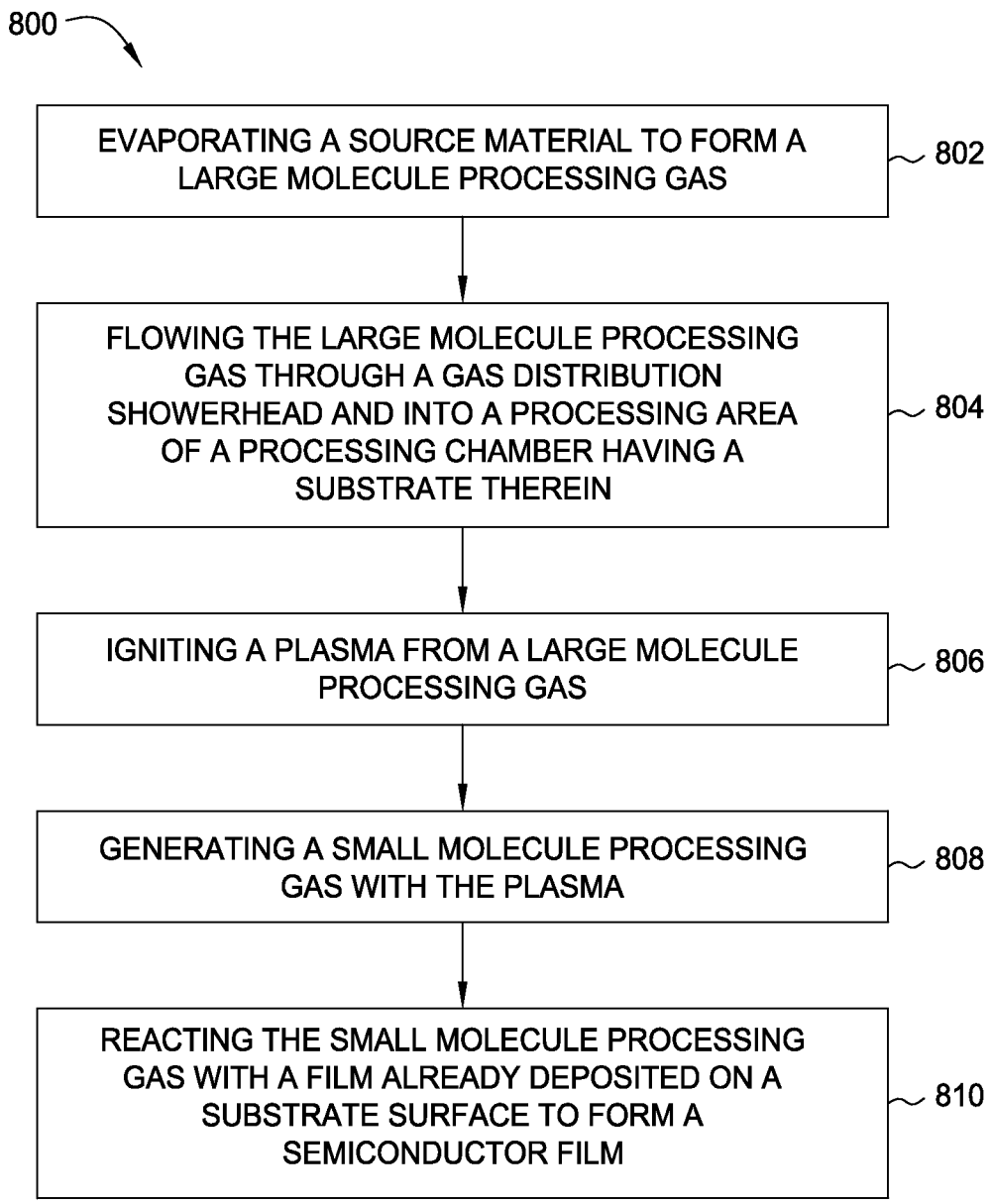
FIG. 8 is a schematic diagram of an operational sequence for processing a substrate according to one embodiment of the present invention.
Figure 9:
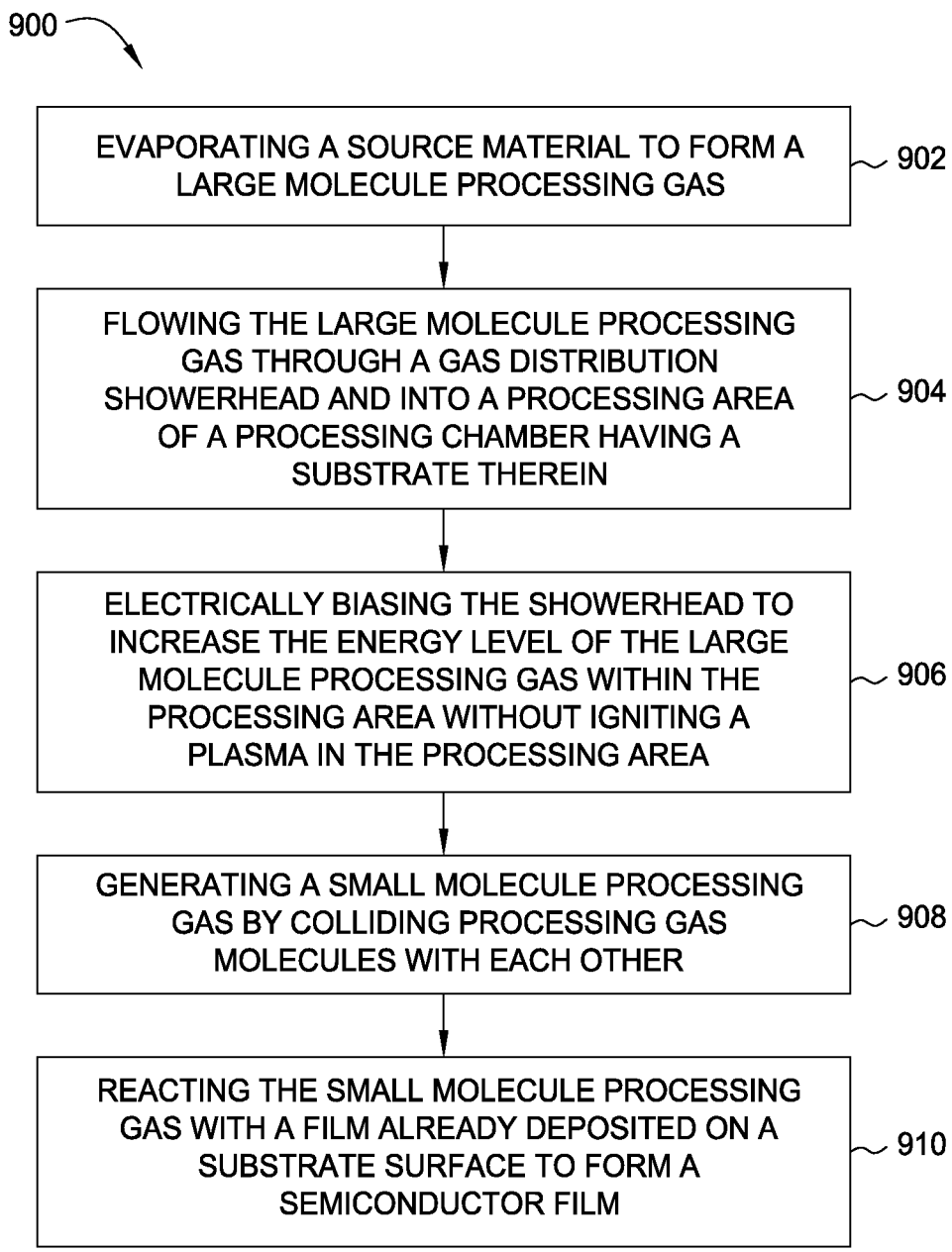
FIG. 9 is a schematic diagram of an operational sequence for processing a substrate according to one embodiment of the present invention.
Figure 10:
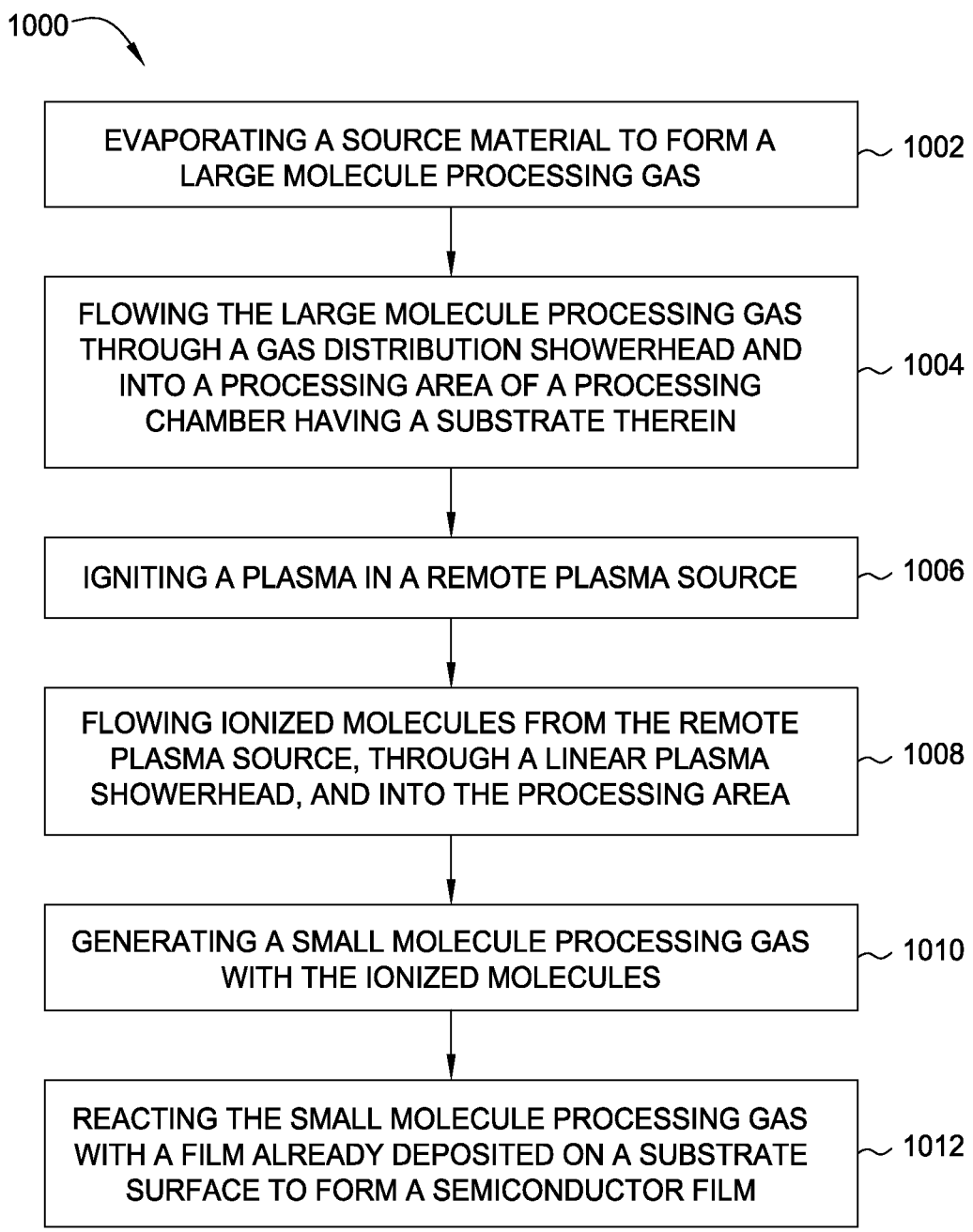
FIG. 10 is a schematic diagram of an operational sequence for processing a substrate according to one embodiment of the present invention.

Turning now to FIGS. 8-10, various embodiments of processing substrates within the previously described chambers will be discussed. FIG. 8 is a schematic diagram of an operational sequence for processing a substrate according to one embodiment of the present invention. A method 800 for forming a photovoltaic device is illustrated and may be used with the processing chambers disclosed in FIGS. 3 and 7.

The method 800 includes evaporating a source material to form a large molecule processing gas, box 802, and flowing the large molecule processing gas through a gas distribution showerhead and into a processing area of a processing chamber having a substrate therein, box 804. The method also includes igniting a plasma from the large molecule processing gas, box 806, generating a small molecule processing gas with the plasma, box 808, and reacting the small molecule processing gas with a film already deposited on a substrate surface to form a semiconductor film, box 810. Thus in this embodiment, the plasma is ignited near the surface of the substrate to form an interface.

In one embodiment of the invention, the source material is chosen from the group consisting of chalcogenides, pnictides, and nitrides. Chalcogenides include sulfides, selenides, and tellurides. Pnictides include elements from the nitrogen group of the periodic table such as nitrogen, phosphorous, arsenic, antimony, and bismuth.

In one embodiment, the source material comprises selenium. As selenium vaporizes, it tends to form a large cluster multi-atomic molecule, such as $[Se_n]$ where n is greater than 5. The selenium is ignited to form a plasma, which causes the larger cluster molecules to begin to collide, which may result in smaller cluster multi-atomic molecules, such as $[Se_n]$ where n is less than 5. In one embodiment, the plasma is ignited with sufficient power to create small molecule processing gas of selenium clusters where n is 4 or less, such as selenium clusters having only 1, 2, or 3 atoms.

As the selenium clusters become smaller molecules, such as clusters having only 1, 2, or 3 selenium atoms, they become more reactive without raising the substrate temperature to high levels which is normally necessary in a thermal evaporative selenization process to energize the selenium clusters to a reactive state. For example, the temperatures may reach as high as 500-600° C. in thermal evaporative selenization processes. The source material, the gas conduit, and the showerhead may need to maintain these temperatures or higher to sufficiently flow the Se molecules into the chamber. The required high temperatures of a furnace for formation of the correct phase of CIGS would be a concern in a continuous inline process due to difficulty in heating large area substrates to relatively higher temperatures for the desired reactions. Typically, the deposition temperature may be greater than 400° C. and as high as 600° C. for co-deposition of copper, indium, gallium, selenide in conventional thermal evaporative selenization processes. Deposition temperatures may be even higher if selenization is done as a post CIG deposition operation.

However, in embodiments of the present invention, the substrate temperatures are expected to be 400° C. and lower. The more reactive smaller selenium clusters formed according to embodiments of the invention enhances formation and uniformity of the correct CIGS phase with reduced need for thermal enhancement. Further, the linear gas distribution showerheads in some embodiments provide a "line source" for large area inline coating systems, such as those required to lower the CoO of photovoltaic solar cells.

In embodiments of the invention where CIGS photovoltaic solar cells are formed, the film already deposited on the substrate surface would comprise copper, indium, and gallium. The method of depositing the CIG film may be co-evaporative or co-sputtering in an inline continuous manufacturing system. Once the glass substrate with the CIG film is processed according to disclosed embodiments, the semiconductor film then has a structure generally represented by the formula $CuIn_xGa_{(1-x)}Se_2$ where $0 \leq x \leq 1$.

The power source for igniting the plasma may be direct current, alternating current, pulsed direct current, RF, electron cyclotron resonance (ECR), and microwave power. The power level may vary in different embodiments of the invention. For example, the power level may be 100 W/in$^2$ where the power level is in terms of watts/length pertaining to the showerhead. Varying the power level may alter the distribution of different species and not necessarily a distinct regime of one species versus another species.

FIG. 9 is a schematic diagram of an operational sequence for processing a substrate according to one embodiment of the present invention. A method 900 for forming a photovoltaic device is illustrated and may be used with the processing chambers disclosed in FIGS. 3 and 7.

The method 900 includes evaporating a source material to form a large molecule processing gas, box 902, and flowing the large molecule processing gas through a gas distribution showerhead and into a processing area of a processing chamber having a substrate therein, box 904. The method also includes electrically biasing the showerhead to increase the energy level of the large molecule processing gas within the processing area without igniting a plasma in the processing area, box 906. Further, the method includes generating a small molecule processing gas by colliding processing gas molecules with each other, box 908, and reacting the small molecule processing gas with a film already deposited on a substrate surface to form a semiconductor film, box 910.

The method 900 disclosed in FIG. 9 may also comprise further embodiments such as those described in FIG. 8. In one embodiment, igniting a plasma from a large molecule processing gas may be combined with electrically biasing the showerhead to increase the energy level of the large molecule processing gas in order to generate a small molecule processing gas. In another embodiment, plasma may be directed onto the substrate to add additional energy to affect the growth and reaction phenomena with the existing CIG film.

One difference between method 800 and 900, however, is that method 900 does not actually ignite a plasma from the processing gas. Rather the power source only applies a sufficient power level to the linear showerhead to increase the energy level of the processing gas, thereby inducing collisions between the processing gas molecules which generate smaller processing gas molecules. For example, the processing gas may include selenium clusters having 5 or more atoms initially, but after passing through the energized showerhead, the large selenium clusters are more excited and begin to collide together generating smaller clusters, though no plasma state has been reached. It should be noted that the collisions between the processing gas molecules to generate the smaller molecule processing gas may be between both large and small molecule clusters.

FIG. 10 is a schematic diagram of an operational sequence for processing a substrate according to one embodiment of the present invention. A method 1000 for forming a photovoltaic device is illustrated and may be used with processing chambers disclosed in FIGS. 4-6.

The method includes evaporating a source material to form a large molecule processing gas, box 1002, and flowing the large molecule processing gas through a gas distribution showerhead and into a processing area of a processing chamber having a substrate therein, box 1004. The method also includes igniting a plasma in a remote plasma source, box 1006, and flowing ionized molecules from the remote plasma source, through a linear plasma showerhead, and into the processing area, box 1008. The method further includes generating a small molecule processing gas with the ionized molecules, box 1010, and reacting the small molecule processing gas with a film already deposited on a substrate surface to form a semiconductor film, box 1012.

Further embodiments of method 1000 may also comprise other embodiments similar to those previously discussed in relation to FIGS. 8 and 9. The difference between method 800, 900, and 1000 is that method 1000 utilizes a remote plasma source to provide the means to excite the large molecule processing gas, causing the molecular collisions to occur that results in smaller processing gas molecules. Often times a remote plasma source is chosen when subjecting a substrate directly to plasma is undesirable, such as discussed above. Rather than directly subjecting the substrate to plasma, ionized species from the plasma are directed towards the processing region to react with the substrate. Remote plasma often results in less surface damage to the substrate as the ionized molecules lose some energy when travelling from the remote plasma source to the processing region within the processing chamber.

Additionally, in some embodiments, the plasma in the remote plasma source is non-reactive and formed from non-reactive species. For example, the non-reactive plasma may be chosen from the group consisting of helium, argon, krypton, xenon, and radon. The plasma of the non-reactive species may not be a component of the film deposited on the substrate in the processing chamber. Additionally, in some embodiments, the plasma may be chosen from the group consisting of oxygen, nitrogen, and hydrogen, such as if it is desired to form an oxide layer on or near the substrate. In these embodiments, the plasma from the remote plasma source may form a film on the substrate in the processing chamber.

In the remote plasma source embodiment, when selenium is the source gas, neutral selenium is flowing through and out of the linear showerhead. The plasma is used to send ionized gas through the plasma distribution showerhead to bombard the selenium vapor, not to create selenium plasma. In other words, the remote plasma source excites the selenium in the processing region near the surface of the substrate and breaks it up into smaller clusters.

In embodiments of the invention, the ratio of ionized gas to the processing gas can be controlled as they are mixed together in the processing region near the substrate surface, which may enhance reactivity and control of the selenization process. Thus, embodiments of the invention provide the ability to control the ratio of ionized gas to process gas at the point of consumption. Further, a carrier gas may be used in any of the embodiments. For example, hot argon (Ar) or helium (He) gas may be fed into the Se source to carry the Se vapor into the chamber. For a remote plasma type embodiment, the Ar or He gas may be fed into a separate line to a remote plasma generation source, which is fed subsequently into the deposition chamber. In another embodiment, a hot Ar source may be run simultaneously through the Se source. The above embodiments of the invention provide for the controlled effusion rate of selenium towards the substrate surface. In this case, the carrier gas may enhance the plasma intensity for improved formation of energetic small molecules.

Embodiments of the invention also provide the ability to better control the selenization of thicker CIGS films. For example, if a CIGS film of four microns is desired, forming the CIG film to four microns followed by the conventional methods for performing the selenization operation may not result in adequate penetration of selenium into the CIG film, which may result in less desirable film properties and lower electrical generation efficiencies. However, embodiments of the present invention provide a continuous inline photovoltaic solar cell production system with multiple CIG deposition-selenization operations that can deposit, for example, a half micron CIG film on or near a substrate, followed by a selenization operation, and repeated until the desired CIGS film thickness is achieved. In this example, the CIG formation and selenization operation would be repeated eight times along the continuous inline photovoltaic solar cell production system, alternating between CIG deposition and selenization to eventually create a CIGS film thickness of 4 microns. A correct and improved CIGS film may thereby be manufactured more efficiently.

Embodiments of the invention may also provide improved control of surface morphology of the depositing film layers to minimize and possibly eliminate pinholes and create smooth surfaces. Additionally, embodiments of the invention improve induction of forming reacted phases with existing layers or with additional co-depositing species. Moreover, these improvements can be achieved at lower processing temperatures.

While the foregoing is directed to embodiments of the present invention, other and further embodiments of the invention may be devised without departing from the basic scope thereof, and the scope thereof is determined by the claims that follow.

The invention claimed is:

1. A method for forming a photovoltaic device, comprising:
   evaporating a source material to form a large molecule processing gas;
   flowing the large molecule processing gas through a gas distribution showerhead and into a processing area of a processing chamber having a substrate therein;
   electrically biasing the gas distribution showerhead to increase energy level of the large molecule processing gas within the processing area without igniting a plasma;
   after electrically biasing the gas distribution showerhead, igniting a plasma from the large molecule processing gas, the plasma having a power level;
   generating a small molecule processing gas with the plasma; and
   reacting the small molecule processing gas with a film already deposited on a substrate surface to form a semiconductor film.

2. The method of claim 1, wherein the source material comprises selenium.

3. The method of claim 2, wherein the large molecule processing gas of selenium comprises selenium clusters having five or more selenium atoms.

4. The method of claim 2, wherein the small molecule processing gas of selenium comprises selenium clusters having four or less selenium atoms.

5. The method of claim 4, wherein the film already deposited on the substrate surface comprises copper, indium, and gallium.

6. The method of claim 5, wherein the semiconductor film has a structure represented by the formula $CuIn_xGa_{(1-x)}Se_2$ where $0<x<1$.

7. A method for forming a photovoltaic device, comprising:
   evaporating a source material to form a large molecule processing gas;
   flowing the large molecule processing gas through a gas distribution showerhead and into a processing area of a processing chamber having a substrate disposed therein;
   applying a power level to the gas distribution showerhead to generate a small molecule processing gas from the large molecule processing gas without igniting a plasma; and
   reacting the small molecule processing gas with a film already deposited on a substrate surface to form a semiconductor film.

8. The method of claim 7, wherein the source material comprises selenium.

9. The method of claim 8, wherein the large molecule processing gas of selenium comprises selenium clusters having five or more selenium atoms.

10. The method of claim 8, wherein the small molecule processing gas of selenium comprises selenium clusters having four or less selenium atoms.

11. The method of claim 10, wherein the film already deposited on the substrate surface comprises copper, indium, and gallium.

12. The method of claim 11, wherein the semiconductor film has a structure represented by the formula $CuIn_xGa_{(1-x)}Se_2$ where $0<x<1$.

* * * * *